United States Patent
Musa et al.

(10) Patent No.: US 9,831,835 B2
(45) Date of Patent: Nov. 28, 2017

(54) MULTIPLE PATH AMPLIFIER WITH PRE-CANCELLATION

(71) Applicant: Freescale Semiconductor, Inc., Austin, TX (US)

(72) Inventors: Sarmad K. Musa, Gilbert, AZ (US); Ramanujam Srinidhi Embar, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/055,330

(22) Filed: Feb. 26, 2016

(65) Prior Publication Data

US 2017/0250656 A1   Aug. 31, 2017

(51) Int. Cl.

| H03F 3/68 | (2006.01) |
|---|---|
| H03F 1/02 | (2006.01) |
| H03F 3/21 | (2006.01) |
| H03F 3/19 | (2006.01) |
| H01P 5/12 | (2006.01) |

(52) U.S. Cl.
CPC ............. *H03F 1/0288* (2013.01); *H01P 5/12* (2013.01); *H03F 3/19* (2013.01); *H03F 3/211* (2013.01); *H03F 2200/451* (2013.01); *H03F 2203/21142* (2013.01)

(58) Field of Classification Search
CPC ......... H03F 3/68; H03F 1/3223; H03F 1/3229
USPC .............................................. 330/124 R, 151
See application file for complete search history.

(56) References Cited

U.S. PATENT DOCUMENTS

| 3,471,798 | A | | 10/1969 | Seidel |
|---|---|---|---|---|
| 5,004,317 | A | | 4/1991 | Jackson et al. |
| 5,831,478 | A | | 11/1998 | Long |
| 5,912,586 | A | * | 6/1999 | Mitzlaff ................ H03F 1/3229 330/149 |
| 6,760,230 | B2 | * | 7/2004 | Kooker ................ H05K 9/0037 330/149 |
| 2003/0076166 | A1 | | 4/2003 | Hellberg |
| 2009/0322430 | A1 | | 12/2009 | Romero et al. |
| 2015/0170986 | A1 | | 6/2015 | Szymanowski et al. |
| 2015/0263681 | A1 | | 9/2015 | Embar et al. |

FOREIGN PATENT DOCUMENTS

| EP | 1583228 A2 | 10/2005 |
|---|---|---|
| EP | 2216901 A1 | 8/2010 |

* cited by examiner

*Primary Examiner* — Steven J Mottola

(57) ABSTRACT

A device includes a first amplifier coupled to a first signal conduction path and a second amplifier coupled to a second signal conduction path. A first coupler is coupled to the first signal conduction path. The first coupler is configured to produce an output signal based on a first signal carried by the first signal conduction path. A delay element is configured to impose a phase delay on the output signal of the first coupler to generate a delayed output signal. The device includes a second coupler coupled to the second signal conduction path. The second coupler is connected to the delay element and configured to inject the delayed output signal into the second signal conduction path.

18 Claims, 7 Drawing Sheets

MULTIPLE PATH AMPLIFIER WITH PRE-CANCELLATION

FIELD OF THE INVENTION

Embodiments of the inventive subject matter relate to an amplifier and more specifically to an amplifier having multiple paths in which a pre-cancellation signal is injected into at least one of the amplifier's paths to minimize the effects of inter-path signal coupling.

BACKGROUND OF THE INVENTION

Multiple-path amplifiers are amplifiers commonly used in wireless communication systems. One specific type of multiple-path amplifier is a Doherty amplifier in which device's various amplifiers may operate in different classes. Today, Doherty amplifiers are used increasingly in base stations that enable the operation of wireless communications networks. Doherty amplifiers include separate amplification paths— typically a carrier path and a peaking path. The two paths may be configured to operate at different classes. More particularly, the carrier amplification path may typically operate in a class AB mode and the peaking amplification path may be biased such that it operates in a class C mode. This can enable improved power-added efficiency and linearity of the amplifier, as compared to a balanced amplifier, at the power levels commonly encountered in wireless communications applications.

In a Doherty amplifier, as well as other types of multiple-path amplifiers, the signals carried on the different paths of the amplifier may be, to some degree, inductively coupled to one another. As a result, signals propagating through one path of the amplifier may be transmitted, via the inductive coupling, into the other paths of the amplifier. This can be detrimental to the amplifier's overall performance, reducing the amplifier's linearity and efficiency.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

Figure 1:
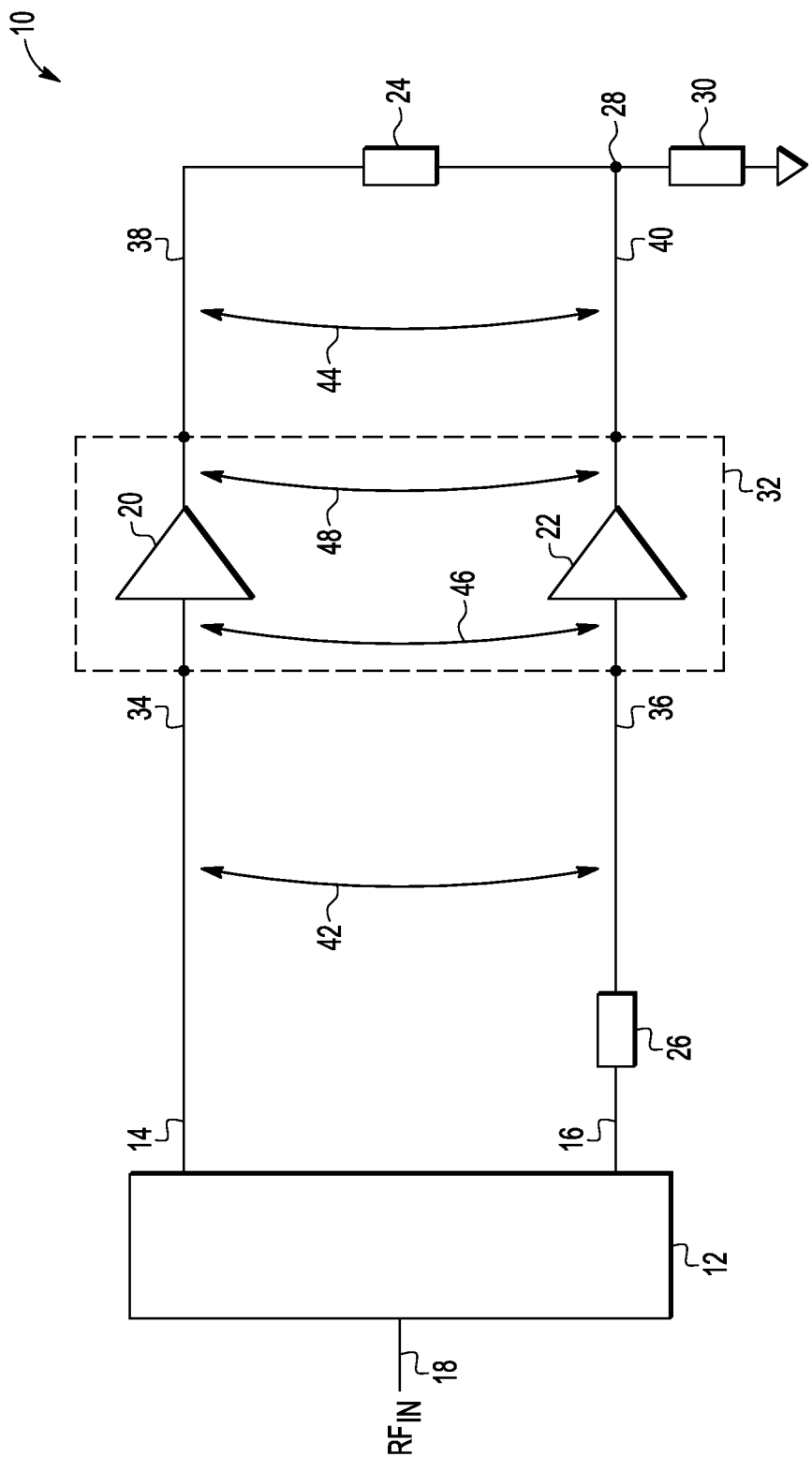
FIG. 1 shows a conventional amplifier lineup including a first and second amplifier as well as corresponding amplifier paths.

In overview, the present disclosure describes embodiments of the inventive subject matter that relate to an amplifier and more specifically to an amplifier having multiple paths in which at least one pre-cancellation signal is injected into at least one of the amplifier's paths to minimize the effects of inter-path coupling.

Multiple-path amplifiers are amplifiers commonly used in wireless communication systems or other systems calling for the amplification of electrical signals. In conventional multiple-path amplifiers the various amplifier paths may be inductively coupled to one another. As a result, signals propagating through one path of the amplifier may induce, via the inductive coupling, similar signals in the other paths of the amplifier. This can be detrimental to the amplifier's overall performance, reducing the amplifier's linearity and efficiency.

In embodiments of the present system and method, a coupler is connected to a first path in the amplifier. The coupler outputs a signal that is generally the same shape as the signal transmitted through the first path, but may be of reduced magnitude. The output of the coupler is then delayed to generate a pre-cancellation signal that will destructively interfere with signals being induced in other paths of the amplifier. The pre-cancellation signal can then be injected into the other paths of the amplifier to cancel or reduce the signals induced therein.

In some embodiments, only a single pre-cancellation signal is generated so as to cancel the signal induced from one path of the amplifier into the amplifier's other paths. In other embodiments, however, a pre-cancellation signal could be generated for each path in the amplifier so as to cancel the various signals induced in each path of the amplifier by every other path of the amplifier. For example, in an amplifier having two paths, a first pre-cancellation signal could be generated using the signal transmitted through the first path. The first pre-cancellation signal could then be injected into the amplifier's second path to cancel or reduce a signal induced therein by the signal in the amplifier's first path. Conversely, a second pre-cancellation signal could be generated using the signal transmitted through the amplifier's second path. The second pre-cancellation signal could then be injected into the amplifier's first path to cancel or reduce a signal induced therein by the signal in the amplifier's second path.

In various implementations, multiple path amplifiers, such as Doherty amplifiers, are used in a number of wireless applications, as the amplifiers enable high efficiency over a wide output power range and can achieve a desired linearity using various linearization schemes. In many implementations, Doherty amplifiers generally include two amplifiers— a carrier or main amplifier, and a peaking amplifier. In a symmetric Doherty amplifier, the carrier and peaking amplifiers are the same size. Asymmetric Doherty amplifiers employ a peaking amplifier that is larger than the carrier amplifier and offer the potential for additional efficiency improvements.

In a Doherty amplifier, an input signal is split at an input or power splitter between the carrier and peaking amplification path or circuit. The split signals are then separately amplified by the carrier and peaking amplifiers of the Doherty amplifier and combined at an output stage.

FIG. 1 shows a conventional Doherty amplifier 10 lineup including a main or carrier path and a peaking path. In FIG. 1 as shown, a power splitter 12 is coupled to a first signal conduction path 14 (e.g., a main or carrier path that runs from power splitter 12 to output node 28 of amplifier 10) and a second signal conduction path 16 (e.g., a peaking path that runs from power splitter 12 to output node 28 of amplifier 10) of amplifier 10. The power splitter 12 is configured to divide an input 18 signal (e.g., radio frequency in (RFIN)) into multiple signals that are each transmitted along different amplification paths. In FIG. 1, the power splitter 12 generates two output signals.

In one implementation, the power splitter 12 can include a power divider with an input for receiving an input radio frequency signal, and first and second divider outputs. When connected to a symmetrical Doherty amplifier, the power splitter 12 may divide or split an input signal received at the input 18 into two signals that are very similar with, in some embodiments, equal power. In other cases, though, the power splitter 12 may output signals having unequal power.

The outputs of the power splitter 12 are connected to amplifier 20 (e.g., a main or carrier amplifier) and amplifier 22 (e.g., a peaking amplifier). Each of amplifiers 20, 22 (and amplifiers 554, 556, 704, 706, 708, discussed later) may be embodied as one or more high-power transistor (e.g., laterally diffused metal oxide semiconductor (LDMOS) transistor(s), high electron mobility transistor(s) (HEMT), or other types of transistors) formed in and over a semiconductor substrate (e.g., silicon, gallium nitride, gallium arsenide, or other substrates). Amplifier 20 can be coupled via an input impedance matching network or circuit (not illustrated) to a first output of power splitter 12. Amplifier 22 can be coupled via an input impedance matching network or circuit (not illustrated) to a second output of power splitter 12. As will be appreciated by those of ordinary skill based on the description herein, amplifier 20 and amplifier 22 may include one or more stages of relatively low power level amplification and relatively high power level amplification.

An output impedance matching network and an impedance inverter or a λ/4 transmission line phase shift element 24 may be connected between the output of amplifier 20 and a summing or output node 28, and the output of amplifier 22 also is coupled to output node 28 through an output impedance matching network. The phase shift introduced by element 24 is, in some implementations, compensated by a 90 degree relative phase shift present on peaking path 16 introduced by phase shift element 26. Alternatively, amplifier 10 may have an "inverted Doherty" configuration. In such a configuration, the impedance inverter or λ/4 line phase shift element 24 is connected between the output of amplifier 22 and output node 28, rather than being connected between the output of amplifier 20 and output node 28, and the phase shift element 26 is connected along path 14 between the first output of power splitter 12 and the first amplifier 20.

The outputs of amplifier 20 and amplifier 22 are combined at output node 28. Another impedance matching network, represented by element 30, operates to present the proper load impedances to each of amplifier 20 and amplifier 22. In a real-world implementation, element 30 may be replaced by a suitably configured transmission line or impedance transformer and output network, where the transmission line or impedance transformer has an impedance selected to match the impedance of amplifier 10 to the desired load.

Amplifier 10 can be configured so that amplifier 20 provides the amplification for lower level input signals, and both amplifier 20 and amplifier 22 operate in combination to provide the amplification for high input level signals. In one implementation, amplifier 20 is configured to amplify a signal received from path 14, while amplifier 22 is configured to amplify a signal received from path 16 only when the input signal to amplifier 10 exceeds a predetermined threshold.

In various embodiments, amplifier 20, amplifier 22, and portions of the above-mentioned input and output impedance matching networks may be implemented or housed within a single packaged device 32 (e.g., an air cavity package or a plastic encapsulated package with input and output leads), or may be housed within distinctly packaged devices. In addition, amplifier 20 and amplifier 22 may be formed as portions of a single or integrated circuit (IC), or may be formed on separate ICs. Amplifiers 20, 22 may be single stage or multiple-stage amplifiers. In either case, both amplifier 20 and amplifier 22 may be formed using suitable semiconductor fabrication processes. For example, using those techniques the amplifier IC(s) may be formed within an active surface of a wafer formed from a bulk semiconductor material, e.g., silicon. Portions of the IC(s) may be formed over the wafer by a variety of semiconductor processes, including layering, patterning, doping, and heat treatment. In the layering process, semiconductor materials can be grown or deposited on the wafer substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Device 32 includes a number of terminals or contact pads enabling device 32 to be connected to other system components, including, but not limited to, power splitter 12, phase shift element 26, phase shift element 24, and output node 28. Components external to device 32 may be formed over or connected to a surface of a printed circuit board (PCB) or other suitable substrate enabling the formation or connection of such components.

In other embodiments, however, a multiple-path amplifier 10 may be implemented in which amplifier 20 and amplifier 22 are not formed within the same device and are instead discrete components mounted separately, for example, to a PCB. As such, amplifier 20 and amplifier 22 may be separate and distinct components.

The amplifier 10 architecture depicted in FIG. 1 is widely used in communication systems due to the architecture's capability to deliver high efficiency over an extended input signal range. The architecture can also linearize well using Digital Pre-Distortion (DPD) techniques.

During operation of amplifier 10, signals, such as RF signals, are propagated along both path 14 and path 16. Due to their configuration and proximity, signals carried by components connected to both path 14 and path 16 (e.g., amplifier 20 and amplifier 22, components of the input and output impedance matching circuits, and bondwires coupling the various components) can, to some degree, become coupled to one another via inductive or capacitive coupling. This may involve, for example, the input and output matching networks of each amplifier becoming coupled, potentially through the air, through encapsulation, or through a substrate over which amplifier 20 and amplifier 22 are formed or mounted. As a result of that inductive or capacitive coupling, a signal propagating through one of amplifier 20 and amplifier 22 (and the amplifier's corresponding path) can cause a similar, though generally lower-magnitude, signal to be generated in the other of amplifier 20 and amplifier 22 (and the amplifier's corresponding path). The induced signal will generally have the same shape as the signal causing the induced signal to be generated.

With reference to FIG. 1, for example, traces 34 and 36, which form inputs to device 32 and may be formed over a PCB, for example, may be inductively coupled to one another as illustrated by arrow 42. In a similar fashion, traces 38 and 40, which form outputs from device 32 and may also be formed over the same PCB, can be inductively coupled to one another as illustrated by arrow 44. Within device 32, signals carried on the input and output leads, bondwires, and impedance matching circuits coupled to each of amplifier 20 and amplifier 22 can also become coupled to one another as indicated by arrows 46 and 48.

When signals propagating through one path of amplifier 10 cause other signals to be induced within the other paths of amplifier 10, this can be detrimental to the amplifier's overall performance. The induced signals, for example, can alter the load profile of either of amplifier 20 and amplifier 22 which can, in turn, reduce the linearity of amplifier 10 as well as the efficiency of amplifier 10.

In the present disclosure, therefore, in a multiple-path amplifier, a signal from one path is captured and converted into a pre-cancellation signal according to an embodiment. That pre-cancellation signal can then be injected into the other paths of the multiple-path amplifier to negate or destructively interfere with at least a portion of induced signals on that path.

Figure 2:
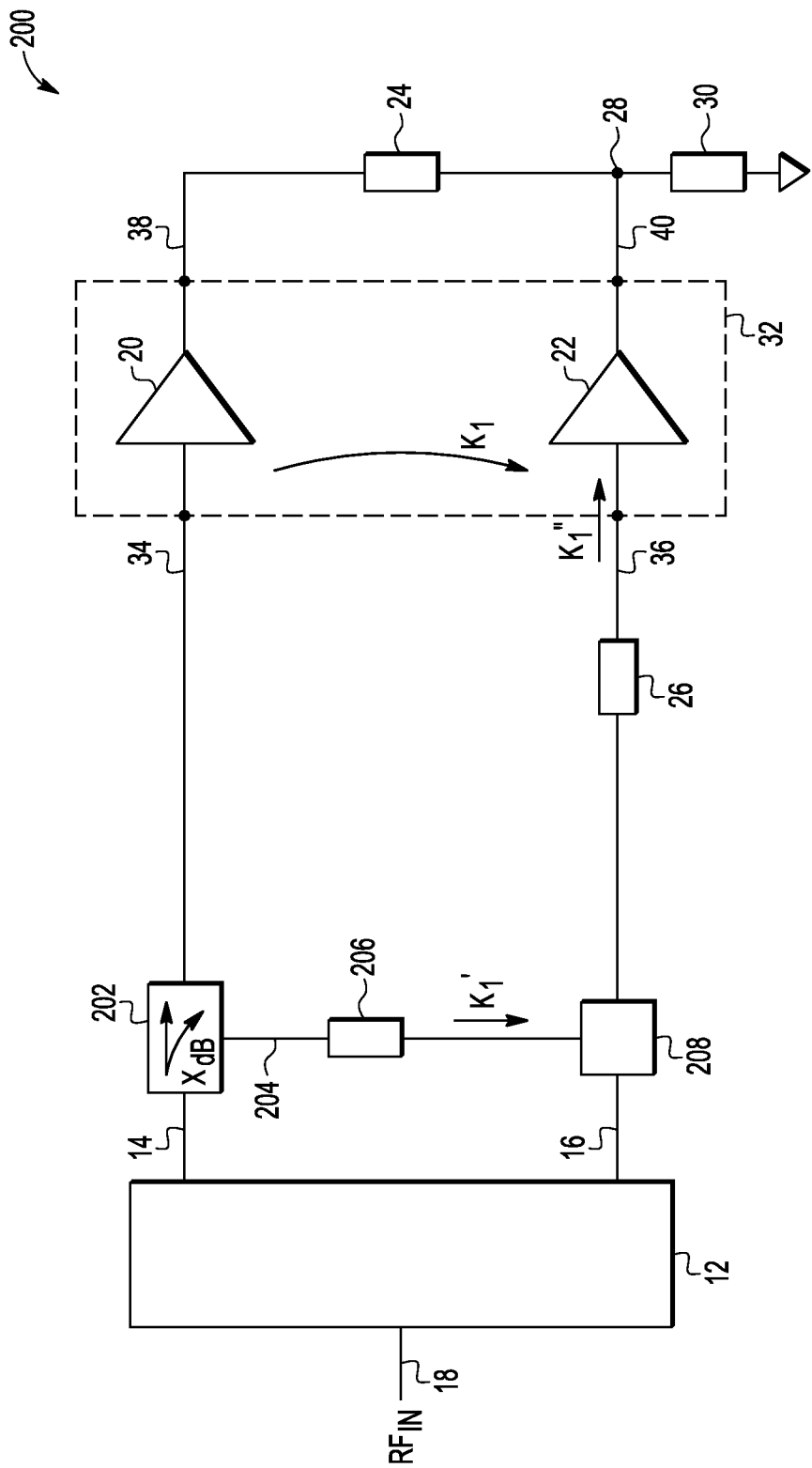
FIG. 2 shows a multiple-path amplifier configuration in which a pre-cancellation signal from one path is injected into the other path of the amplifier.

FIG. 2 shows a multiple-path amplifier device 200 in which a pre-cancellation signal from one path is injected into the other path of the amplifier by a cross-coupling device. FIG. 2 generally shows the amplifier configuration of FIG. 1 modified to include the cross-coupling device. It will, however, be generally understood that the configuration illustrated in FIG. 2 is applicable to various types of multiple-path amplifiers in addition to the Doherty amplifier configuration illustrated therein. For example, the pre-cancellation signal injection illustrated in FIG. 2 may be utilized in any dual-path amplifier, such as a dual-path amplifier utilized as a driver for a final stage in a Doherty or other amplifier configuration. In such an implementation, device 200 may not require power splitter 12 and the outputs of amplifier 20 and 22 may not be combined at an output node 28 and may instead be isolated from one another.

As shown in FIG. 2, directional coupler 202 is connected to first path 14 in the amplifier. Directional coupler 202 is shown connected to path 14 between the output of power splitter 12 and an input to device 32, though in various embodiments directional coupler 202 may be connected at any point along path 14. For example, in device 200 configurations in which device 200 is implemented using pre-driver and final stage amplifiers, directional coupler 202 may be coupled between the pre-driver and final stage amplifiers. Further, directional coupler 202 may be located outside or inside of device 32 Directional coupler 202 is configured to couple a pre-determined amount of electromagnetic energy from first path 14 into output path 204 of directional coupler 202. In other words, directional coupler 202 generates a lower-magnitude duplicate of the signal propagating along first path 14 and transmits that lower-magnitude duplicate signal along path 204. In some embodiments, the magnitude of the duplicate signal (and the signal induced in path 16) may be from 1% to 50% of the magnitude of the original signal propagating in path 14.

Directional coupler 202 may be implemented by any suitable component or device. For example, directional coupler 202 may be a lumped component, power divider, or other combinations of passive or active components. The magnitude of the signal outputted by directional coupler 202 along path 204 can be determined by the coupling factor of directional coupler 202, which is often expressed as a number of decibels (dB). In one embodiment, directional coupler 202 couples from 1% to 50% of the energy from the signal in path 14 into output path 204. In various embodiments, the signal outputted along path 204 is of the same or similar magnitude to the signal induced within path 16 at the input to and within amplifier 22, as a result of the signal propagating along path 14. This magnitude may be determined in a number of different ways including, for example, the simulation of a particular amplifier configuration or measurement of a prototype amplifier in a lab. Using such a simulated circuit or prototype device, a test signal could be injected into one path of the multiple-path amplifier. The output on the other path in the amplifier could then be monitored to detect an induced signal resulting from the injected test signal. The detected induced signal could be analyzed in comparison to the test signal to determine a magnitude of the induced signal as compared to the injected test signal.

In that case, for a given signal propagating along path 14, it may be possible to determine or estimate the magnitude of the signal that will be induced within path 16. The signal outputted by directional coupler 202 along path 204 can then be configured to be the same or similar magnitude to that induced signal. In other embodiments, the magnitude of the induced signal within path 16 may be measured directly from a sample or prototype device 200.

Path 204 is connected to delay element 206. Delay element 206 is configured to impose a phase delay on signals propagating through path 204. The phase delay is generally configured so that the signal propagating through path 204 will be in an approximately antiphase condition with respect to the signal induced in path 16 at the point in path 16 that the signals coincide. As such, the signal propagating through path 204 will ultimately destructively interfere with at least a portion of the signal induced in path 16. Delay element 206 may be implemented using a transmission line, combinations of lumped or distributed elements, or active components.

That delayed signal is then injected into path 16 by coupler 208. Coupler 208 is shown connected to path 16 between the output of power splitter 12 and phase shift element 26, though in various embodiments coupler 208 may be connected at any point along path 16 (e.g., coupler 208 may be outside or inside of device 32). Coupler 208 may be implemented, for example, as a microstrip coupler, though any suitable mechanism or component for injecting the signal into path 16 may be utilized. For example, coupler 208 may be implemented using a transmission line coupler such as a microstrip coupler, a coupler, hybrid device, power divider, power splitter, or another type of coupler realized with a combination of lumped or distributed elements.

The amount of phase delay that should be imposed by delay element 206 may be determined in a number of different ways including, for example, the simulation of a particular amplifier configuration or measurement of a prototype amplifier in a lab. Using such a simulated circuit or prototype device, a test signal could be injected into one path of the multiple-path amplifier. The output on the other path in the amplifier could then be monitored to detect an induced signal resulting from the injected test signal. The detected induced signal could be analyzed in comparison to the test signal to determine a delay occurring within the amplifier path in which the induced signal is generated. The amount of phase delay imposed by delay element 206 could then, in one embodiment, be set equal to the delay of the induced signal minus the phase delay that would be imposed by the various components through which the signal in path 204 will travel, including components 208 and 206, in this example, before destructively interfering with the induced signal. In some embodiments, the delay imposed by delay element 206 may range from 0 to 360 degrees. In some other embodiments, the delay imposed by delay element 206 may be approximately 250 degrees.

As an illustration, with reference to FIG. 2, a signal is propagating through path 14. Because of inductive coupling between the various components of device 200 (e.g., components of amplifier 20 and amplifier 22 and their input and output impedance matching networks, including bondwires), the signal propagating through path 14 causes another signal $K_1$ to be induced within path 16. Signal $K_1$ may have the same shape and phase as the signal propagating through path 14, but at a reduced magnitude. Directional coupler 202 generates an output signal on path 204 that is of the same or similar magnitude and shape as signal $K_1$ in path 16. Delay element 206 delays signal $K_1$ in path 204 to generate a signal $K1'$. Signal $K1'$ is a pre-cancellation signal. When signal $K1'$ is injected into path 16 and ultimately reaches the induced signal $K_1$ (at this point signal $K_1'$ will be delayed by coupler 208 and phase shift element 26 into signal $K_1''$), signal $K_1''$ will interfere destructively with the induced signal $K_1$. In this configuration, therefore, signal $K_1'$ is a pre-cancellation signal that can be injected into path 16 to cancel signals induced therein by the signal propagating along path 14. In an alternate embodiment, coupler 208 may be positioned between phase shift element 26 and amplifier 22, in which case the delay imposed by phase shift element 26 is not included in signal $K_1''$.

In various embodiments, at or near the location along path 16 at which signal $K_1$ impinges upon path 16, the signal $K_1'$ is either "perfectly antiphase to" (i.e., within 1 degree of being 180 degrees out of phase with respect to) signal $K_1$, "substantially antiphase to" (i.e., within 10 degrees of being 180 degrees out of phase with respect to) signal $K_1$, or "approximately antiphase to" (i.e., within one tenth of a wavelength with respect to) signal $K_1$. As used herein, the term "antiphase to," unless otherwise specified, may mean either perfectly antiphase to, substantially antiphase to, or approximately antiphase to. For example, in some embodiments, the signal $K_1'$ has a wavelength that is within a tenth (1/10) of a wavelength of signal $K_1$. Accordingly, the signal $K_1'$ has a wavelength that is within 10 percent of a wavelength of signal $K_1$. Similarly, in some embodiments, the signal $K_1'$ may have a peak amplitude or magnitude that is within 1/10 of the peak amplitude of signal $K_1$. Accordingly, the signal $K_1'$ may have a peak amplitude or magnitude that is within 10 percent of the peak amplitude of signal $K_1$. Such an approach, although not cancelling out the induced signal within path 16 entirely, may enable device 200 to operate with an improved bandwidth response.

FIG. 2 illustrates an arrangement in which signals induced in path 16 are cancelled by injecting a pre-cancellation signal into path 16. As such, the arrangement is unidirectional. In some circumstances, however, signals propagating in path 16 will themselves induce corresponding signals in path 14. As such, a bidirectional solution may be utilized to cancel or reduce induced signals in both path 14 and path 16.

Figure 3:
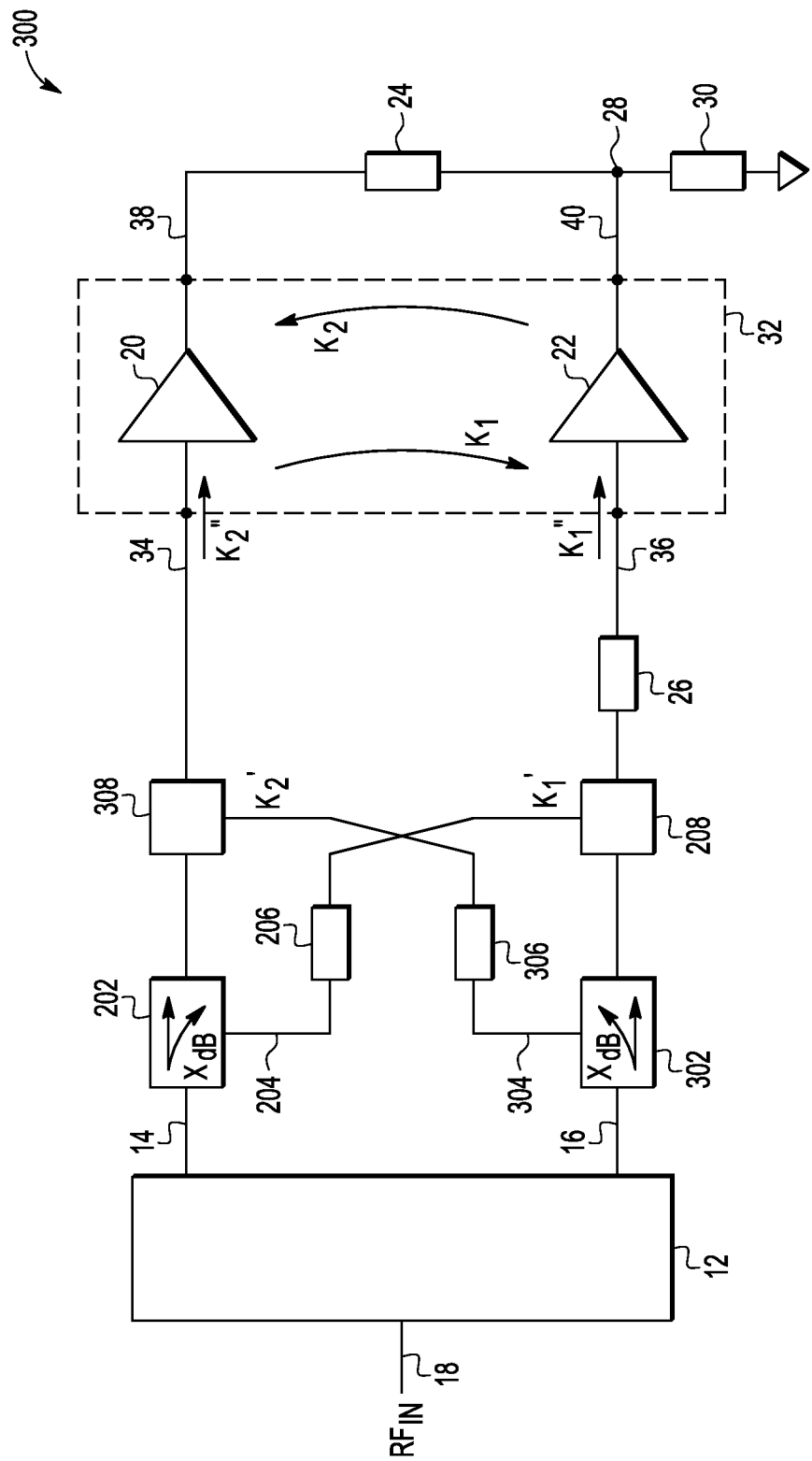
FIG. 3 shows a multiple-path amplifier configuration in which pre-cancellation signals are injected into each path of the amplifier.

FIG. 3 shows a multiple-path amplifier device 300 in which pre-cancellation signals are injected into each amplifier path to cancel or reduce induced signals therein. FIG. 3 shows the circuit of FIG. 2 modified to also inject pre-cancellation signals configured to cancel induced signals propagating in path 14. The pre-cancellation signal injection illustrated in FIG. 3 may be utilized in any dual-path amplifier, such as a dual-path amplifier utilized as a driver for a final stage in a Doherty or other amplifier configurations. In such an implementation, device 300 may not require power splitter 12 and the outputs of amplifier 20 and 22 may not be combined at an output node 28 and may be isolated from one another.

Directional coupler 302 is connected to second path 16 in device 300. Directional coupler 302 is shown connected to path 16 before coupler 208 and phase shift element 26, although coupler 302 could be coupled after phase shift element 26, as well. This may provide that the signal outputted by directional coupler 302 along path 304 does not include the pre-cancellation signal injected into path 16 by coupler 208. Similarly, directional coupler 202 is connected to path 14 before coupler 308, which may provide that the signal outputted by directional coupler 202 does not include the pre-cancellation signal injected into path 14 by coupler 308. For example, in device 300, configurations in which amplifier 22 is implemented using pre-driver and final stage amplifiers, directional coupler 302 may be coupled between the pre-driver and final stage amplifiers. Directional coupler 302 is configured to couple a pre-determined amount of electromagnetic energy from path 16 into output path 304 of directional coupler 302. In other words, directional coupler 302 generates a lower-magnitude duplicate of the signal propagating along path 16 and transmits that lower-magnitude duplicate signal along path 304.

In this arrangement, device 300 includes two pre-cancellation paths. One from directional coupler 202 through delay element 206 and coupler 208 and a second from directional coupler 302 through delay element 306 and coupler 308. The pre-cancellation paths from both directional coupler 202 and directional coupler 302 may be said to overlap one another. As such, in some embodiments, the pre-cancellation paths may be implemented within a multi-layer PCB or other similar structure, with each pre-cancellation path at least partially occupying a different layer within the multi-layer PCB.

Directional coupler 302 may be implemented by any suitable component or device. For example, directional coupler 302 may be a lumped component, power divider, or other combinations of passive or active components. The magnitude of the signal outputted by directional coupler 302 along path 304 is determined by the coupling factor of directional coupler 302, which is often expressed as a number of dB. In one embodiment, directional coupler 302 couples from 1% to 50% of the energy from the signal in path 16 into output path 304. In various embodiments, the signal outputted along path 304 is of the same or similar magnitude to the signal induced within path 14 and amplifier 20 as a result of the signal propagating along path 16. This magnitude may be determined in a number of different ways including, for example, the simulation of a particular amplifier configuration. In that case, for a given signal propagating along path 16, it may be possible to determine or estimate the magnitude of the signal that will be induced within path 14. The signal outputted by directional coupler 302 along path 304 can then be configured to be the same or similar magnitude to that induced signal. In other embodiments, the magnitude of the induced signal within path 14 may be measured directly of a sample or prototype device. In some embodiments, the magnitude of the induced signal in path 14 may range from 1% to 50% of the signal propagating in path 16.

Path 304 is connected to delay element 306. Delay element 306 is configured to impose a phase delay on signals propagating through path 304. The phase delay is generally configured so that the signal propagating through path 304 will be in an approximately antiphase condition with respect to the signal induced in path 14 at the point in path 14 that the signals coincide. As such, the signal propagating through path 304 will ultimately destructively interfere with at least a portion of the signal induced in path 14. Delay element 306 may be implemented using a transmission line, combinations of lumped or distributed elements, or active components.

That delayed signal is then injected into path 14 by coupler 308. Coupler 308 is shown connected to path 14 between the output of directional coupler 202 and device 32, though in various embodiments coupler 308 may be connected at any point along path 14 after directional coupler 202. Coupler 308 may be implemented, for example, as a microstrip coupler, though any suitable mechanism or component for injecting the signal into path 14 may be utilized. For example, coupler 308 may be implemented using a transmission line coupler such as a microstrip coupler, a coupler, hybrid device, divider, splitter, or another type of coupler realized with a combination of lumped or distributed elements. The amount of phase delay that should be imposed by delay element 306 may be determined in a number of different ways including, for example, the simulation of a particular amplifier configuration. The amount of phase delay imposed by delay element 306 may, in one embodiment, be set equal to the delay of the induced signal in path 14 minus the phase delay that would be imposed by the various components through which the signal in path 304 will travel before destructively interfering with the induced signal. In some embodiments, the delay imposed by delay element 306 may range from 0 to 360 degrees. In some other embodiments, the delay imposed by delay element 306 may be approximately 250 degrees.

As an illustration, with reference to FIG. 3, a signal is propagating through path 16. Because of inductive coupling between the various components of device 300 (e.g., components of amplifier 20 and amplifier 22 and their input and output impedance matching networks, including bondwires), the signal propagating through path 16 causes another signal $K_2$ to be induced within path 14. Signal $K_2$ has the same shape and phase as the signal propagating through path 16, but is at a reduced magnitude. Directional coupler 302 generates an output signal on path 304 that is of the same or similar magnitude and shape as signal $K_2$ in path 14. Delay element 306 delays signal $K_2$ in path 304 to generate a signal $K_2'$. Signal $K_2'$ is a pre-cancellation signal. When signal $K_2'$ is injected into path 14 and ultimately reaches the induced signal $K_2$ (at this point signal $K_2'$ will be delayed by coupler 208 into signal $K_2''$), signal $K_2'$ will interfere destructively with the induced signal $K_2$. In this configuration, therefore, signal $K_2'$ is a pre-cancellation signal that can be injected into path 14 to cancel signals induced therein by the signal propagating along path 16.

In various embodiments, at or near the location along path 16 at which signal $K_2$ impinges upon path 14, the signal $K_2'$ is either perfectly antiphase to, substantially antiphase to, or approximately antiphase to signal $K_2$. For example, in some embodiments, the signal $K_2'$ has a wavelength that is within a tenth (⅒) of a wavelength of signal $K_2$. Similarly, in some embodiments, the signal $K_2'$ may have a peak amplitude that is within ⅒ of the peak amplitude of signal $K_2$. Such an approach, although not cancelling out the induced signal within path 14 entirely, may enable device 300 to operate with an improved bandwidth response.

In device 300, two separate unidirectional signal paths are created to inject pre-cancellation signals into each of path 14 and 16. In other embodiments, however, a single bi-directional signal path may be formed between the two amplifier paths in order to carry both pre-cancellation signals.

Figure 4:
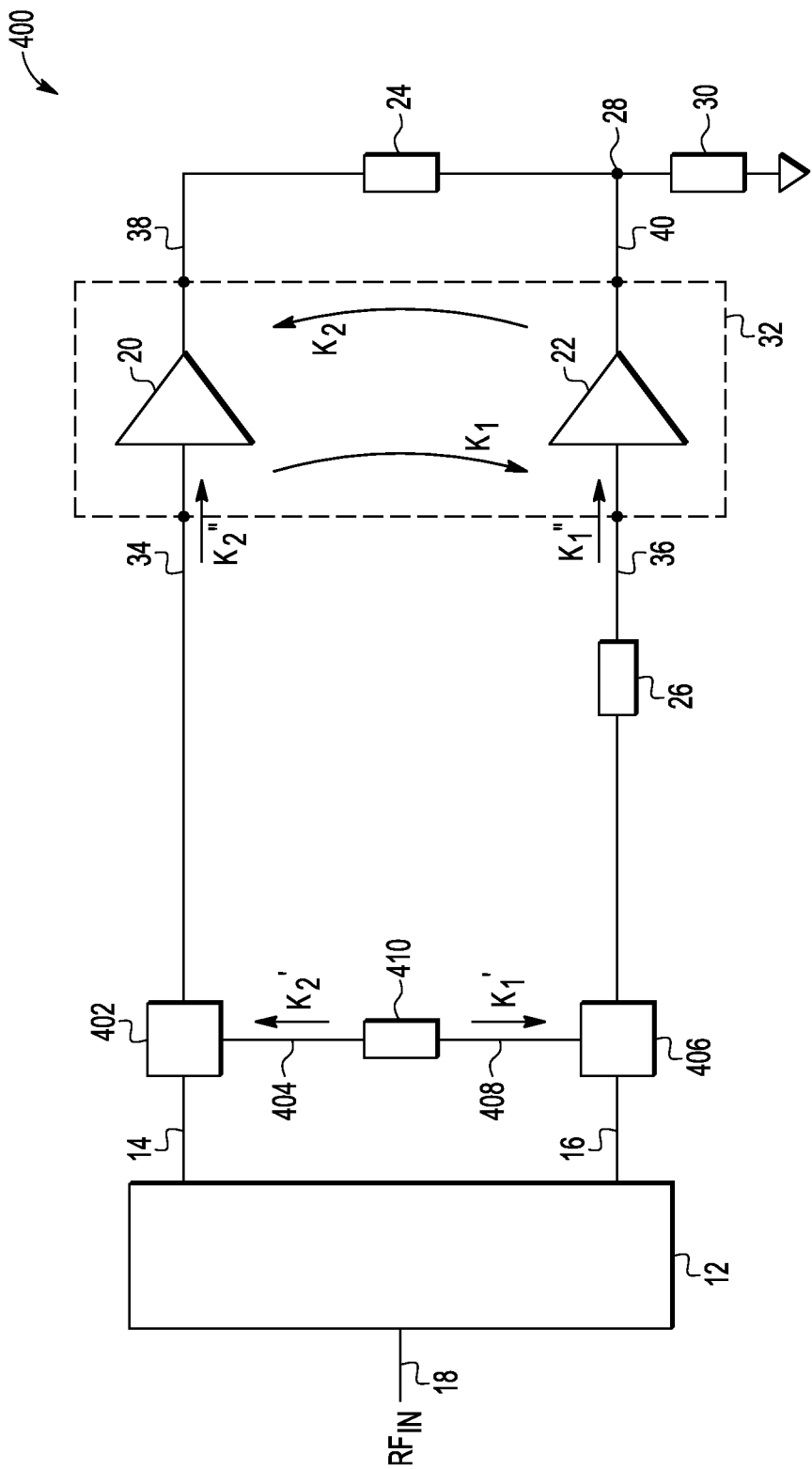
FIG. 4 shows an alternative multiple-path amplifier configuration in which pre-cancellation signals are injected into each path of the amplifier.

FIG. 4 shows a multiple-path amplifier configuration in which pre-cancellation signals are fed into each path of the amplifier. FIG. 4 generally shows the amplifier configuration of FIG. 1 modified to include a cross-coupling device. It will, however, be generally understood that the configuration illustrated in FIG. 4 is applicable to various types of multiple-path amplifiers in addition to the Doherty amplifier configuration illustrated therein. The pre-cancellation signal injection illustrated in FIG. 4 may be utilized in any dual-path amplifier, such as a dual-path amplifier utilized as a driver for a final stage in a Doherty or other amplifier configuration. In such an implementation, device 400 may not require power splitter 12 and the outputs of amplifier 20 and 22 may not be combined at an output node 28 and may be isolated from one another.

As shown in FIG. 4, coupler 402 is connected to first path 14 in the amplifier. Coupler 402 is shown connected to path 14 between the output of power splitter 12 and an input to device 32, though in various embodiments coupler 402 may be connected at any point along path 14. For example, in device 400 configurations in which amplifier 20 is implemented using pre-driver and final stage amplifiers, coupler 402 may be coupled between the pre-driver and final stage amplifiers. Coupler 402 is configured to couple a pre-determined amount of electromagnetic energy from first path 14 into output path 404, with the remaining electrical energy passing through coupler 402 along path 14. In other words, coupler 402 generates a lower-magnitude duplicate of the signal propagating along first path 14 and transmits that lower-magnitude duplicate signal along path 404. Coupler 402 is also configured to receive a signal via path 404 and feed that signal into path 14 of device 400. Although not illustrated in FIG. 4, path 404 may include at least two conductors (e.g., one conductor to provide electromagnetic energy from coupler 402 to delay element 410, and a second conductor to provide electromagnetic energy from the delay element 410 to coupler 402).

Coupler 406 is connected to second path 16 in device 400. Coupler 406 is shown connected to path 16 between power splitter 12 and phase shift element 26, though in various embodiments coupler 406 may be connected at any point along path 16. For example, coupler 406 may be coupled between phase shift element 26 and the input to amplifier 22. Alternatively, in device 400 configurations in which amplifier 22 is implemented using pre-driver and final stage amplifiers, coupler 406 may be coupled between the pre-driver and final stage amplifiers. Coupler 406 is configured to couple a pre-determined amount of electromagnetic energy from path 16 into output path 408 of coupler 406, with the remaining electrical energy passing through coupler 406 along path 16. In other words, coupler 406 generates a lower-magnitude duplicate of the signal propagating along path 16 and transmits that lower-magnitude duplicate signal along path 408. Coupler 406 is also configured to receive a signal via path 408 and feed that signal into path 16 of device 400. Although not illustrated in FIG. 4, path 408 may include at least two conductors (e.g., one conductor to provide electromagnetic energy from coupler 406 to delay element 410, and a second conductor to provide electromagnetic energy from the delay element 410 to coupler 406).

Couplers 402 and 406 may be implemented by any suitable components or devices. For example, couplers 402 and 406 may be lumped components, power dividers, microstrip couplers, transmission line couplers, hybrid devices, dividers, splitters, or other types of couplers realized with a combination of lumped or distributed elements or other combinations of passive or active components. The magnitude of the signals outputted by couplers 402 and 406 along paths 404 and 408, respectively, are determined by the coupling factors of couplers 402 and 406. In various embodiments, the signal outputted along path 404 is of the same or similar magnitude to the signal induced within path 16 as a result of the signal propagating along path 14. Similarly, the signal outputted along path 408 may be of the same or similar magnitude to the signal induced within path 14 as a result of the signal propagating along path 16. These magnitudes may be determined in a number of different ways including, for example, the simulation of a particular amplifier configuration or measurements of a sample or prototype device.

Paths 404 and 408 are connected to bi-directional delay element 410. Delay element 410 is configured to impose phase delays on signals propagating through paths 404 and 408 in either direction. Delay element 410 may be implemented using one or more transmission lines, combinations of lumped or distributed elements, or active components.

The delayed signals are then injected into paths 14 and 16 by couplers 402 and 406, respectively. Generally, delay element 410 is configured to impose a phase delay on signals passing through delay element 410. The amount of phase delay that should be imposed by delay element 410 may be determined in a number of different ways including, for example, the simulation of a particular amplifier configuration.

Because delay element 410 is configure to impose the same delay on signals traveling in both directions through delay element 410, the configuration illustrated in FIG. 4 is generally suited for device 400 devices in which the phase delays of both path 14 and path 16 through device 400 are approximately equal. In one embodiment, approximately equal phase delays may involve the phase delays being within 10% of one another. In configurations of device 400 in which each of path 14 and path 16 exhibit different delays, configurations such as that illustrated in FIG. 3 may be better suited in which each pre-cancellation path may be configured with different delays. Different delays may occur in the paths of a multiple-path amplifier, for example, if the amplifiers connected to each path are asymmetrical, or if output matching networks of each path are different from one another.

During operation of device 400, a signal is propagating through path 14. Because of inductive coupling between the various components of device 400 (e.g., components of amplifier 20 and amplifier 22 and their input and output impedance matching networks, including bondwires), the signal propagating through path 14 causes another signal $K_1$ to be induced within path 16. Signal $K_1$ has a similar shape and phase as the signal propagating through path 14, but may be at a reduced magnitude. Coupler 402 generates an output signal on path 404 that is of the same magnitude and shape as signal $K_1$ in path 16. Delay element 410 delays signal $K_1$ of path 404 to generate a signal $K_1'$ that is coupled into path 16 by coupler 406, and that ultimately reaches the induced signal $K_1$ (at this point signal $K_1'$ will be delayed into signal $K_1''$) and destructively interferes with signal $K_1$. Signal $K_1'$ is, therefore a pre-cancellation signal.

Similarly, a signal is propagating through path 16. Because of inductive coupling between the various components of device 400, the signal propagating in path 16 causes another signal $K_2''$ to be induced within path 14. Signal $K_2''$ has the same shape and phase as the signal in path 16, but may be at a reduced magnitude. Coupler 406 generates an output signal on path 408 that is of the same magnitude and shape as the portion of the signal propagating in path 14 resulting from the induced signal in path 14 from the signal in path 16. Delay element 410 delays signal $K_2$ of path 408 to generate a signal $K_2'$ that is coupled into path 14 by coupler 402, and that ultimately reaches the induced signal $K_2$ (at this point signal $K_2'$ will be delayed into signal $K_2''$) and destructively interferes with signal $K_2$. In this configuration, therefore, signal $K_2'$ is a pre-cancellation signal that can be injected into path 14 to cancel signals induced therein by the signal propagating along path 16.

In various embodiments, at or near the location along path 16 at which signal $K_1$ impinges upon path 16, the signal $K_1'$ is either perfectly antiphase to, substantially antiphase to, or approximately antiphase to signal $K_1$. For example, in some embodiments, the signal $K_1'$ has a wavelength that is within a tenth (1/10) of a wavelength of signal $K_1$. Similarly, in some embodiments, the signal $K_1'$ may have a peak amplitude that is within 1/10 of the peak amplitude of signal $K_1$. Similarly, the signal $K_2'$ may either be perfectly antiphase to, substantially antiphase to, or approximately antiphase to signal $K_2$. For example, in some embodiments, the signal $K_2'$ has a wavelength that is within a tenth (1/10) of a wavelength of signal $K_2$. Similarly, in some embodiments, the signal $K_2'$ may have a peak amplitude that is within 1/10 of the peak amplitude of signal $K_2$. Such an approach, although not cancelling out the induced signals within path 14 and path 16 entirely, may enable device 400 to operate with an improved bandwidth response.

In some embodiments of multiple-path amplifier devices, the magnitudes and phase delays for pre-cancellation signals can vary over time based upon the operational conditions of the device. As such, the magnitude and delay of the various pre-cancellation signals may be adjusted based upon the current operating conditions of the amplifier device.

Figure 5:
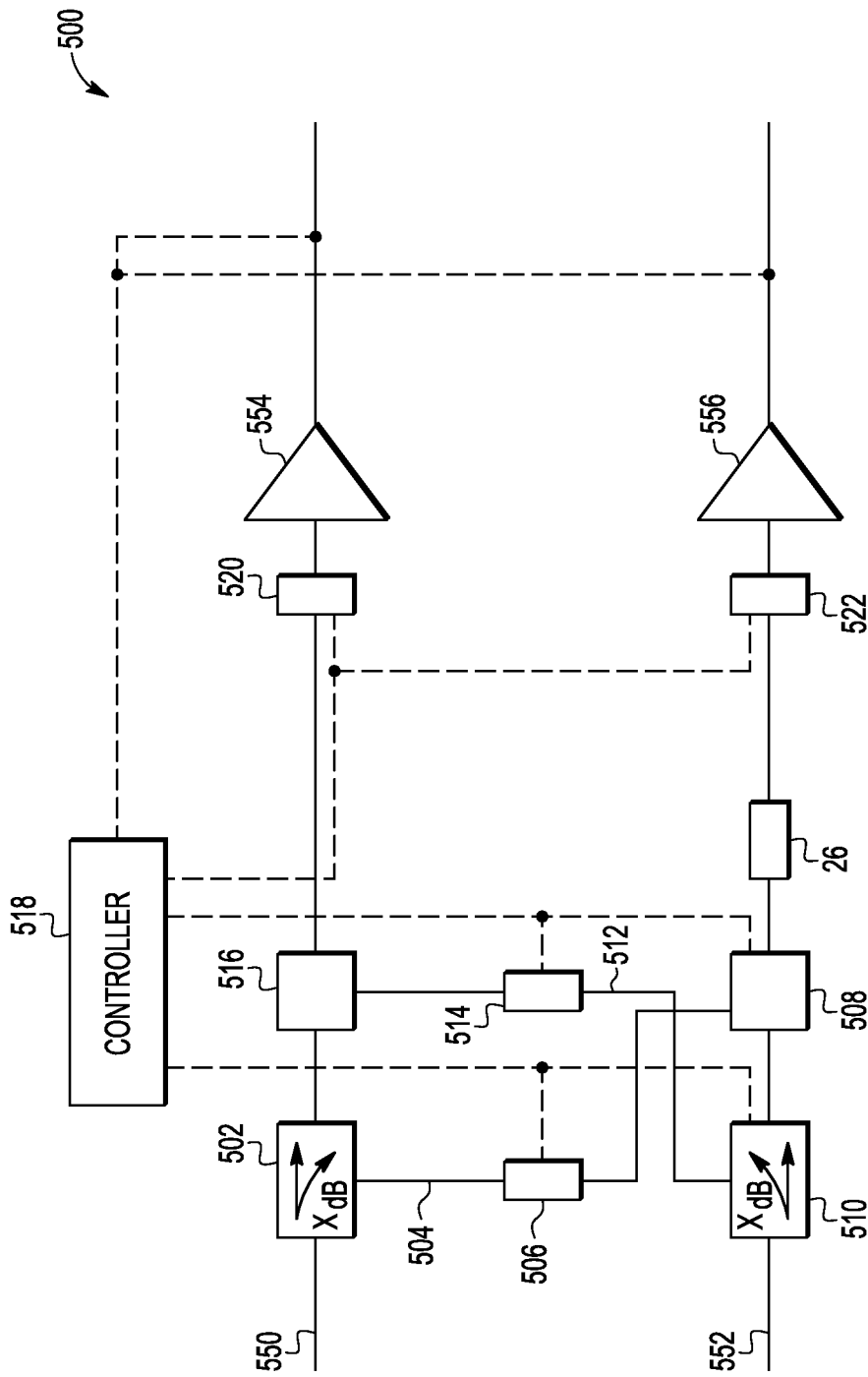
FIG. 5 shows a multiple-path amplifier configuration in which a controller is configured to adjust the configuration of a number of device components to generate pre-cancellation signals that are injected into each path of the amplifier.

FIG. 5 shows a multiple-path amplifier configuration in which a controller is configured to adjust configuration of a number of device components to generate pre-cancellation signals that are fed into each path of the amplifier. The configuration illustrated in FIG. 5 is applicable to various types of multiple-path amplifiers including Doherty amplifier configurations, for example.

In FIG. 5, adjustable coupler 502 is coupled to path 550 that runs throughout device 500. Adjustable coupler 502 may be connected at any point along path 550. For example, in device 500 configurations in which amplifier 554 is implemented using pre-driver and final stage amplifiers, adjustable coupler 502 may be coupled between the pre-driver and final stage amplifiers. Adjustable coupler 502 is configured to couple a variable amount of electromagnetic energy from path 550 into output path 504, with the remaining electrical energy passing through adjustable coupler 502 along path 550. The amount of energy coupled by adjustable coupler 502 into path 550 is determined by an input from controller 518, as described below. In other words, adjustable coupler 502 generates a lower-magnitude duplicate of the signal propagating along first path 550 and transmits that lower-magnitude duplicate signal along path 504. Adjustable coupler 502 may be implemented as a transmission line coupler such as a microstrip coupler, a coupler, hybrid device, divider, splitter, or another type of coupler realized with a combination of lumped or distributed elements.

Path 504 is connected to delay element 506. Delay element 506 is configured to impose a phase delay on signals propagating through path 504. The phase delay is generally configured to put the signal propagating through path 504 into a perfectly, substantially or approximately antiphase condition with respect to the signal induced by the signal in path 550 into path 552. The amount of delay imposed by delay element 506 on signals from path 504 is determined by controller 518. Delay element 506 may be implemented using one or more transmission lines, combinations of lumped or distributed elements, and/or active components. That delayed signal is then injected into path 552 by coupler 508. Coupler 508 is connected to path 552 after adjustable coupler 510. Coupler 508 may be implemented, for example, as a microstrip coupler, though any suitable mechanism or component for injecting the signal into path 552 may be used. For example, coupler 508 may be implemented using a transmission line coupler such as a microstrip coupler, a coupler, hybrid device, divider, splitter, or another type of coupler realized with a combination of lumped or distributed elements.

Device 500 also includes adjustable coupler 510 coupled to path 552 that runs throughout device 500. Adjustable coupler 510 is shown connected to path 552 before coupler 508. For example, in device 500 configurations in which amplifier 22 is implemented using pre-driver and final stage amplifiers, adjustable coupler 510 may be coupled between the pre-driver and final stage amplifiers. In addition, adjustable coupler 510 and/or coupler 508 may be implemented before or after phase delay element 26. Adjustable coupler 510 is configured to couple a variable amount of electromagnetic energy from path 552 into output path 512, with the remaining electrical energy passing through adjustable coupler 510 along path 552. The amount of energy coupled by adjustable coupler 510 into path 512 is determined by an input from controller 518, as described below. In other words, adjustable coupler 510 generates a lower-magnitude duplicate of the signal propagating along path 552 and transmits that lower-magnitude duplicate signal along path 512. Adjustable coupler 510 may be implemented as a transmission line coupler such as a microstrip coupler, a coupler, hybrid device, divider, splitter, or another type of coupler realized with a combination of lumped or distributed elements.

Path 512 is connected to delay element 514. Delay element 514 is configured to impose a phase delay on signals propagating through path 512. The phase delay is generally configured to put the signal propagating through path 512 into a perfectly, substantially, or approximately antiphase condition with respect to the signal induced in path 550 from the signal in path 552. The amount of delay imposed by delay element 514 on signals from path 512 is determined by controller 518. Delay element 514 may be implemented using one or more transmission lines, combinations of lumped or distributed elements, and/or active components.

That delayed signal is then injected into path 550 by coupler 516. Coupler 516 is shown connected to path 550 after adjustable coupler 502. Coupler 516 may be implemented, for example, as a microstrip coupler, though any suitable mechanism or component for injecting the signal into path 550 may be utilized. For example, coupler 516 may be implemented using a transmission line coupler such as a microstrip coupler, a coupler, hybrid device, divider, splitter, or another type of coupler realized with a combination of lumped or distributed elements.

In this arrangement, device 500 includes two pre-cancellation paths. One from adjustable coupler 502 through delay element 506 and coupler 508 and a second from adjustable coupler 510 through delay element 514 and coupler 516. The pre-cancellation paths from both adjustable coupler 502 and adjustable coupler 510 may be said to overlap one another. As such, in some embodiments, the pre-cancellation paths may be implemented within a multiple-layer PCB or other similar structure, with each pre-cancellation path occupying a different layer within the multi-layer PCB.

Controller 518 is configured to monitor the operation of device 500 and is configured to modify the operation of one or more of adjustable coupler 502, adjustable coupler 510, delay element 506 and delay element 514 based upon that operation. According to various embodiments, controller 518 may be included within the same packaged device as amplifiers 554, 556, couplers 502, 508, 510, 516, and/or delay elements 506, 514, or may be external to the packaged device, and may be coupled through package terminals to the components that are internal to the packaged device.

For example, controller 518 may adjust the amount of electromagnetic energy coupled by adjustable couplers 502, 510 (e.g., the coupling factors). Similarly, controller 518 may adjust the amount of phase delay imposed upon pre-cancellation signals by each of delay elements 506, 514. In one embodiment, controller 518 is connected to, and configured to monitor, the output of each of amplifier 554 and amplifier 556. By monitoring the output of each amplifier, controller can determine the operation of device 500 and make adjustments to optimize that operation. In other embodiments, however, controller 518 could be configured to monitor additional and/or other attributes of device 500, such as an input signal to either of path 550 and path 552 and/or the input signals to amplifiers 554, 556, to determine how best to optimize the signal processing performed by the components of device 500.

Figure 6:
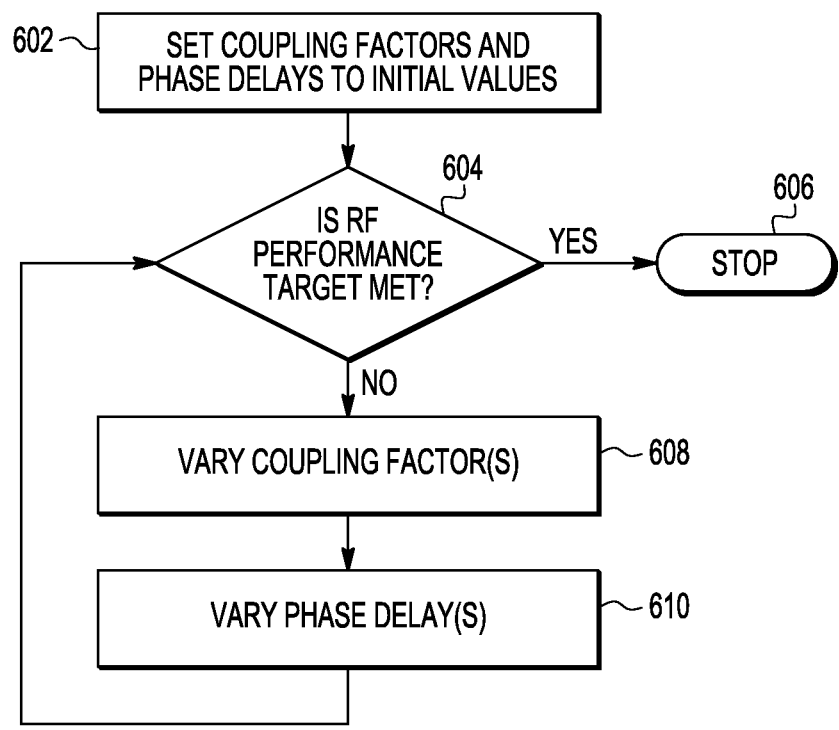
FIG. 6 is a flowchart showing a method for adjusting a pre-cancellation signal injected into a path of a multiple-path amplifier.

FIG. 6, for example, is a flowchart showing one example method that may be implemented by controller 518 to adjust components of device 500. In step 602, controller 518 initially sets the coupling factors of adjustable couplers 502, 510 and the phase delays of delay elements 506, 514 to initial values. The initial values may be, for example, default values that have previously been determined to be satisfactory for a typical operation of device 500. Alternatively, the initial values may be nominal values (e.g., zero or some other value).

In step 604, with the currently applied coupling factors and/or phase delays, controller 518 determines whether a particular RF performance target is met by the current operations of device 500. This may involve, for example, controller 518 monitoring the inputs and/or outputs of amplifier 554 and amplifier 556 and determining whether the monitored signals indicate 1) acceptable signal isolation (or coupled signal cancellation) between the paths of the amplifier (e.g., the small signal coupling/isolation between all paths may be measured and determined to be within target values or outside of target values), and/or 2) acceptable linearity, efficiency, and/or linearizability of the amplifier (e.g., the linearity, efficiency, and/or linearizability in all paths may be measured and determined to be within target values or outside of target values).

When the RF performance target is met, then the controller moves to step 606 and the method ends. Note that the method may again be re-executed sometime in the future (e.g., periodically) to ensure that the coupling factors of adjustable couplers 502, 510 and the phase delays of delay elements 506, 514 are set to appropriate values (e.g., values that result in meeting acceptable RF performance targets). When, however, in step 604 the target is not met, then in step 608 controller 518 may vary one or more of the coupling factors of adjustable coupler 502,510 and in step 610 vary one or more of the phase delays of delay elements 506, 514. Steps 608, 610 may involve, for example, controller 518 adjusting the coupling factors and phase delays randomly, or according to a pre-defined routine. In other embodiments, the coupling factors and phase delays may be adjusted based upon the magnitudes or other characteristics of the output signals from amplifier 554 and amplifier 556 or other operational characteristics of device 500.

After varying the coupling factors and phase delays in steps 608, 610, controller 518 returns to step 604 to determine whether the RF performance target has been met. If not, controller 518 will continue varying the coupling factors and phase delays until the target is met.

Returning to FIG. 5, controller 518 may be a microcontroller, microprocessor, application-specific integrated circuit (ASIC), analog or digital circuit, or any other component configured to monitor an operation (e.g., input/output signals) of amplifier 554 and amplifier 556 and modify the operation (e.g., applied coupling factor or imposed delay) of one or more of adjustable coupler 502, adjustable coupler 510, delay element 506 and delay element 514 based upon the operation of the amplifier(s) 554, 556.

In some embodiments, device 500 may also include one or more adjustable attenuators and/or adjustable phase shifters coupled along either or both of path 550 and/or path 552 in device 500. For example, each path may include only an adjustable attenuator, only an adjustable phase shifter, or both an adjustable attenuator and an adjustable phase shifter coupled in series with each other (in either order) along each of path 550 and/or path 552. The adjustable attenuators and phase shifters (illustrated collectively by components 520 and 522) enable controller 518 to modulate both the amplitude and phase of signals traveling along path 550 and 552 to amplifier 554 and amplifier 556, respectively.

The present approach for injecting pre-cancellation signals into paths of a multiple-path amplifier has been illustrated in a number of examples including amplifier devices having two paths. It should be understood, however, that the present approaches are equally applicable in multiple-path amplifiers having three or more paths. In a three path amplifier, for example, pre-cancellation signals may be created and injected into the first two paths of the amplifier to cancel induced signals from the third path of the amplifier.

Figure 7:
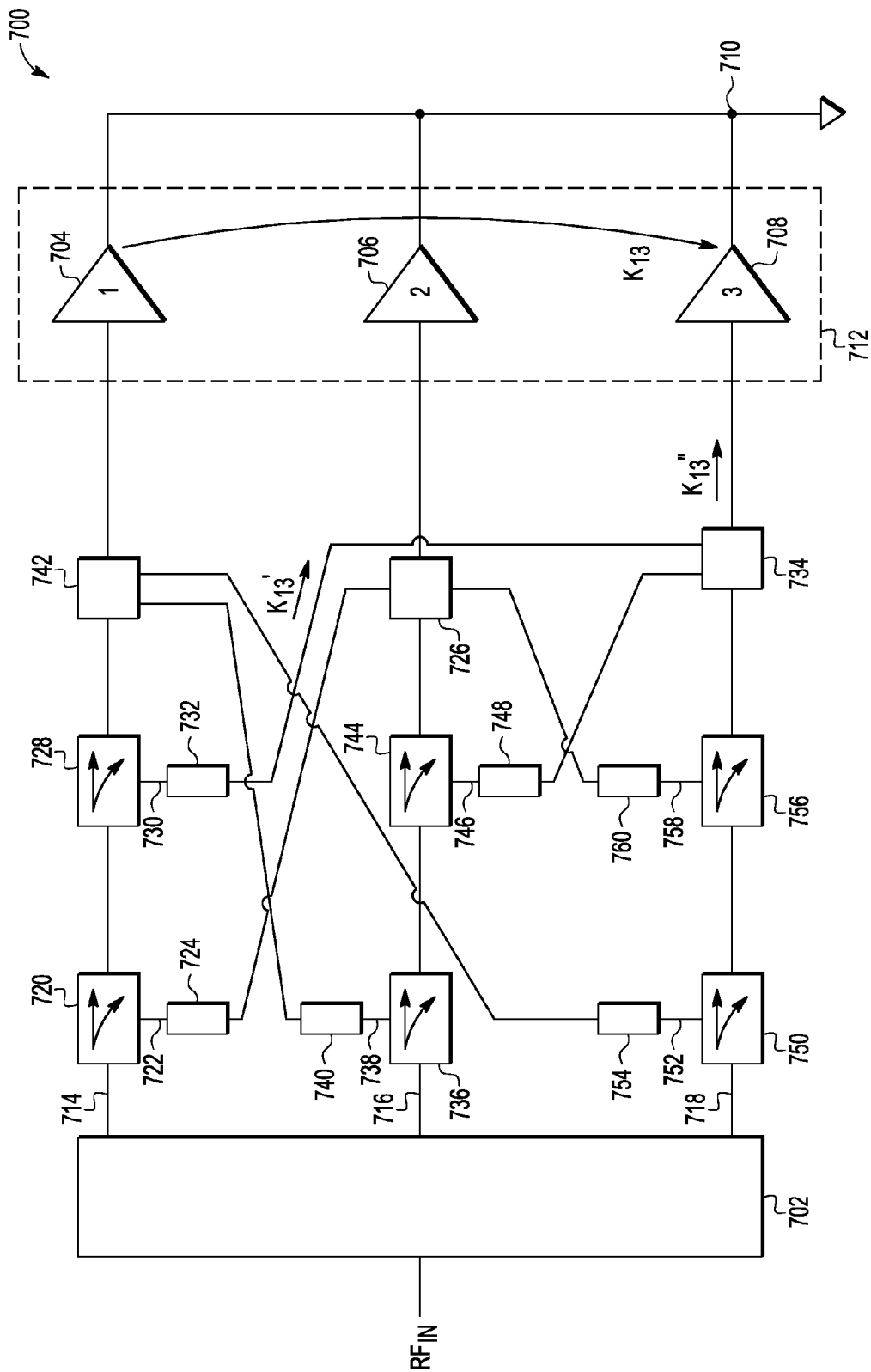
FIG. 7 is shows a three-path amplifier configuration in which pre-cancellation signals are injected into the paths of the amplifier.

FIG. 7 is shows a three-path amplifier 700 configuration in which pre-cancellation signals are injected between the paths of amplifier 700. Power splitter 702 is configured to receive an input signal RFIN and split that input signal into three different output signals having the same or, in some embodiments, different power levels.

The outputs of the power splitter 702 are connected to amplifiers 704, 706, and 708. As will be appreciated by those of ordinary skill based on the description herein, amplifiers 704, 706, and 708 may be single stage amplifiers, or may include one or more stages of relatively low power level amplification and relatively high power level amplification.

The outputs of amplifiers 704, 706, and 708 are combined at output node 710. An impedance matching network (not shown), may operate to present the proper load impedances to each of amplifiers 704, 706, and 708. In addition, one or more phase shift elements may be present between the outputs of amplifiers 704, 706, and 708 to ensure that the output signals from amplifiers 704, 706, 708 are combined at output node 710 in phase with each other.

In various embodiments, amplifiers 704, 706, and 708 may be implemented within a single device package, such as device 712. In that case, amplifiers 704, 706, and 708 may be formed using suitable semiconductor fabrication processes on a single IC or on multiple ICs. Further, input impedance matching networks (not shown) also may be located within the device package between the input leads of device 712 and the amplifier inputs, and output impedance matching networks (not shown) also may be located within the device package between the amplifier outputs and the output leads of device 712.

During operation of amplifier 700, signals, such as RF signals, are propagated along paths 714, 716, and 718. In FIG. 7, each of paths 714, 716, and 718 run through device 700 and connect to output node 710. Due to their configuration and proximity, components connected to paths 714, 716, and 718 (e.g., components of amplifiers 704, 706, and 708 and their input and output impedance matching networks, including bondwires) can, to some degree, become coupled to one another via inductive or capacitive coupling. This may involve, for example, the input and output matching networks of each amplifier becoming coupled to some degree, potentially through the air, through encapsulation, and/or through a substrate over which amplifiers 704, 706, and 708 are formed or mounted. As a result of that inductive or capacitive coupling, a signal propagating through one of amplifiers 704, 706, and 708 can cause a similar, though generally lower-magnitude, signals to be generated in the other of amplifiers 704, 706, and 708. The induced signal(s) will generally have the same or similar shape and phase as the signal causing the induced signal to be generated.

To mitigate or at least partially cancel those induced signals, signals are captured from each path of amplifier 700 and turned into pre-cancellation signals. Those pre-cancellation signals are then injected into the other paths of the multiple-path amplifier to negate or destructively interfere with induced signals in that path.

Directional coupler 720 is connected to path 714 in amplifier 700. Directional coupler 720 is configured to couple a pre-determined amount of electromagnetic energy from path 714. In other words, directional coupler 720 generates a lower-magnitude duplicate of the signal propagating along path 714 and transmits that lower-magnitude duplicate signal along path 722. For a given signal propagating along path 714, the signal outputted by directional coupler 720 along path 722 may be approximately the same magnitude as the signal that will be induced within path 716 by the signal traveling in path 714.

Path 722 is connected to delay element 724. The phase delay implemented by delay element 724 is generally configured to delay the signal propagating through path 722 so that the signal ultimately destructively interferes with at last a portion of the signal induced in path 716 by the signals traveling in path 714. The delayed signal outputted by delay element 724 is then injected into path 716 by coupler 726 to cancel or interfere with the signal induced in path 716 by signals traveling in path 714.

Directional coupler 728 is connected to path 714 in amplifier 700. Directional coupler 728 is configured to couple a pre-determined amount of electromagnetic energy from path 714 to generate a lower-magnitude duplicate of the signal propagating along path 714 and transmits that lower-magnitude duplicate signal along path 730. For a given signal propagating along path 714, the signal outputted by directional coupler 728 along path 730 may be approximately the same magnitude as the signal that will be induced within path 718 by the signal traveling in path 714.

Path 730 is connected to delay element 732. The phase delay implemented by delay element 732 is generally configured to delay the signal propagating through path 730 so that the signal ultimately destructively interferes with at last a portion of the signal induced in path 718 by the signals traveling in path 714. The delayed signal outputted by delay element 732 is then injected into path 718 by coupler 734 to cancel or interfere with the signal induced in path 718 by signals traveling in path 714. In alternate embodiments, a single directional coupler may be used (rather than a directional coupler 720, 728 associated with each other amplifier path 716, 718). Along those lines, a single delay element may be used (rather than a delay element 724, 732 associated with each other amplifier path 716, 718).

Directional coupler 736 is connected to path 716 in amplifier 700. Directional coupler 736 is configured to couple a pre-determined amount of electromagnetic energy from path 716 to generate a lower-magnitude duplicate of the signal propagating along path 716 and transmits that lower-magnitude duplicate signal along path 738. For a given signal propagating along path 716, the signal outputted by directional coupler 736 along path 738 may be approximately the same magnitude as the signal that will be induced within path 714 by the signal traveling in path 716.

Path 738 is connected to delay element 740. The phase delay implemented by delay element 740 is generally configured to delay the signal propagating through path 738 so that the signal ultimately destructively interferes with at last a portion of the signal induced in path 714 by the signals traveling in path 716. The delayed signal outputted by delay element 740 is then injected into path 714 by coupler 742 to cancel or interfere with the signal induced in path 714 by signals traveling in path 716.

Directional coupler 744 is connected to path 716 in amplifier 700. Directional coupler 744 is configured to couple a pre-determined amount of electromagnetic energy from path 716 to generate a lower-magnitude duplicate of the signal propagating along path 716 and transmits that lower-magnitude duplicate signal along path 746. For a given signal propagating along path 716, the signal outputted by directional coupler 744 along path 746 may be approximately the same magnitude as the signal that will be induced within path 718 by the signal traveling in path 716.

Path 746 is connected to delay element 748. The phase delay implemented by delay element 748 is generally configured to delay the signal propagating through path 746 so that the signal ultimately destructively interferes with at last a portion of the signal induced in path 718 by the signals traveling in path 716. The delayed signal outputted by delay element 748 is then injected into path 718 by coupler 734 to cancel or interfere with the signal induced in path 718 by signals traveling in path 716. In alternate embodiments, a single directional coupler may be used (rather than a directional coupler 736, 744 associated with each other amplifier path 714, 718). Along those lines, a single delay element may be used (rather than a delay element 740, 748 associated with each other amplifier path 714, 718).

Directional coupler 750 is connected to path 718 in amplifier 700. Directional coupler 750 is configured to couple a pre-determined amount of electromagnetic energy from path 718 to generate a lower-magnitude duplicate of the signal propagating along path 718 and transmits that lower-magnitude duplicate signal along path 752. For a given signal propagating along path 718, the signal outputted by directional coupler 750 along path 752 may be approximately the same magnitude as the signal that will be induced within path 714 by the signal traveling in path 718.

Path 752 is connected to delay element 754. The phase delay implemented by delay element 754 is generally configured to delay the signal propagating through path 752 so that the signal ultimately destructively interferes with at last a portion of the signal induced in path 714 by the signals traveling in path 718. The delayed signal outputted by delay element 754 is then injected into path 714 by coupler 742 to cancel or interfere with the signal induced in path 714 by signals traveling in path 718.

Directional coupler 756 is connected to path 718 in amplifier 700. Directional coupler 756 is configured to couple a pre-determined amount of electromagnetic energy from path 718 to generate a lower-magnitude duplicate of the signal propagating along path 718 and transmits that lower-magnitude duplicate signal along path 758. For a given signal propagating along path 718, the signal outputted by directional coupler 756 along path 758 may be approximately the same magnitude as the signal that will be induced within path 716 by the signal traveling in path 718.

Path 758 is connected to delay element 760. The phase delay implemented by delay element 760 is generally configured to delay the signal propagating through path 758 so that the signal ultimately destructively interferes with at last a portion of the signal induced in path 716 by the signals traveling in path 718. The delayed signal outputted by delay element 760 is then injected into path 716 by coupler 726 to cancel or interfere with the signal induced in path 716 by signals traveling in path 718. In alternate embodiments, a single directional coupler may be used (rather than a directional coupler 750, 756 associated with each other amplifier path 714, 716). Along those lines, a single delay element may be used (rather than a delay element 754, 760 associated with each other amplifier path 714, 716).

Within amplifier 700, the location of directional couplers 720 and 728 may be changed along path 714, though in one embodiment, the locations of directional couplers 720 and 728 are restricted to being before coupler 742. Similarly, the location of directional couplers 736 and 744 may be changed along path 716, though in one embodiment, the locations of directional couplers 736 and 744 are restricted to being before coupler 726. Similarly, the location of directional couplers 750 and 756 may be changed along path 718, though in one embodiment, the locations of directional couplers 750 and 756 are restricted to being before coupler 734. In alternate embodiments, either or both of directional couplers 720, 728, 736, 744, 750, 756 may be positioned after the coupler 742, 726, 734 within their respective paths 714, 716, 718.

Directional couplers 720, 728, 736, 744, 750, and 756 may be implemented by any suitable component or device and may include a lumped component, power divider, or other combinations of passive or active components. The magnitude of the signal outputted by each directional coupler is determined by the coupling factor of the directional coupler, which is often expressed as a number of dB.

Within amplifier 700, the amount of phase delay that should be imposed by each of delay elements 724, 732, 740, 748, 754, and 760 may be determined in a number of different ways including, for example, by the simulation of a particular amplifier configuration or measurement of a prototype amplifier in a lab. Using such a simulated circuit or prototype device, a test signal could be injected into one path of the multiple-path amplifier. The output on the other paths in the amplifier could then be monitored to detect induced signals resulting from the injected test signal. The detected induced signals could be analyzed in comparison to the test signal to determine a delay occurring within the amplifier paths in which the induced signals are generated.

As an illustration, with reference to FIG. 7, a signal is propagating through path 714. Because of inductive coupling between the various components of device 700 (and, specifically, components of amplifier 704 and amplifier 708), the signal propagating through path 714 causes another signal $K_{13}$ to be induced within path 718. Signal $K_{13}$ has a similar shape and phase as the signal propagating through path 714, but may be at a reduced magnitude. Directional coupler 728 generates an output signal on path 730 that is of a similar magnitude and shape as signal $K_{13}$ in path 718. Delay element 732 delays signal $K_{13}$ in path 730 to generate a signal $K_{13}'$ the ultimately reaches the induced signal $K_{13}$ (at this point signal $K_{13}'$ will be delayed into signal $K_{13}''$) and destructively interferes with signal $K_{13}$. Signal $K_{13}'$ is, therefore a pre-cancellation signal. When signal $K_{13}'$ is injected into path 718, signal $K_{13}''$ interferes destructively with the induced signal $K_{13}$.

In various embodiments, at or near the location along path 16 at which signal $K_{13}$ impinges upon path 718, the signal $K_{13}'$ is either perfectly antiphase to, substantially antiphase to, or approximately antiphase to signal $K_{13}''$. For example, in some embodiments, the signal $K_{13}'$ has a wavelength that is within a tenth (1/10) of a wavelength of signal $K_{13}$. Similarly, in some embodiments, the signal $K_{13}'$ may have a peak amplitude that is within 1/10 of the peak amplitude of signal $K_{13}$. Such an approach, although not cancelling out the induced signal within path 718 entirely, may enable amplifier 700 to operate with an improved bandwidth response.

As indicated above, couplers 202, 208, 302, 308, 402, 406, 502, 508, 510, 516, 720, 726, 728, 734, 736, 742, 744, 750, and 756 may be implemented in various locations along paths 14, 16, 550, 552, 714, 716, 718, in various embodiments. Further, as indicated above, couplers 202, 208, 302, 308, 402, 406, 502, 508, 510, 516, 720, 726, 728, 734, 736, 742, 744, 750, and 756 may be implemented outside of their respective amplifier devices 32, 712 (e.g., on a PCB to which a device 32, 712 is coupled) or inside of their respective amplifier devices 32, 712 (e.g., within the same device package as amplifiers 20, 22, 554, 556, 704, 706, 708).

An embodiment of a multiple-path amplifier includes a power splitter configured to receive a radio frequency input signal, and a first amplifier coupled to a first output of the power splitter by a first signal conduction path. The first amplifier is configured to receive a first signal from the power splitter. The multiple-path amplifier includes a second amplifier coupled to a second output of the power splitter by a second signal conduction path. The second amplifier is configured to receive a second signal from the power splitter. The multiple-path amplifier includes a directional coupler coupled to the first signal conduction path. The directional coupler is configured to couple electromagnetic energy from the first signal conduction path into an output signal. The multiple-path amplifier includes a delay element configured to impose a phase delay on the output signal of the directional coupler to generate a delayed output signal. The phase delay imposed by the delay element is configured to make the delayed output signal antiphase, at a location along the second signal conduction path, to the signal induced in the second path by the first signal in the first path. The multiple-path amplifier includes a coupler coupled to the second signal conduction path. The coupler is connected to the delay element and configured to inject the delayed output signal into the second signal conduction path.

An embodiment of a packaged device includes a first amplifier coupled to a first signal conduction path, a second amplifier coupled to a second signal conduction path, and a first coupler coupled to the first signal conduction path. The first coupler is configured to produce an output signal based on a first signal carried by the first signal conduction path. The packaged device includes a delay element configured to impose a phase delay on the output signal of the first coupler to generate a delayed output signal, and a second coupler coupled to the second signal conduction path. The second coupler is connected to the delay element and configured to inject the delayed output signal into the second signal conduction path.

An embodiment of a device includes an adjustable directional coupler configured to couple to a first signal conduction path of an amplifier. The adjustable directional coupler is configured to produce an output signal based on a first signal in the first signal conduction path of the amplifier. A magnitude of the output signal is determined by a coupling factor of the adjustable directional coupler. The device includes an adjustable delay element configured to impose a phase delay on the output signal of the adjustable directional coupler to generate a delayed output signal, and a coupler configured to couple to a second signal conduction path of the amplifier. The coupler is connected to the adjustable delay element and configured to inject the delayed output signal into the second signal conduction path. The device includes a controller configured to detect a first output of at least one of a first amplifier coupled to the first path and a second amplifier coupled to the second path, and modify at least one of the coupling factor of the adjustable directional coupler and the phase delay of the adjustable delay element based upon the first output of the at least one of the first amplifier and the second amplifier.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A multiple-path amplifier, comprising:
    a power splitter configured to receive a radio frequency input signal;
    a first amplifier coupled to a first output of the power splitter by a first signal conduction path, the first amplifier configured to receive a first signal from the power splitter;
    a second amplifier coupled to a second output of the power splitter by a second signal conduction path, the second amplifier configured to receive a second signal from the power splitter;
    a directional coupler coupled to the first signal conduction path, the directional coupler configured to couple electromagnetic energy from the first signal conduction path into an output signal;
    a delay element configured to impose a phase delay on the output signal of the directional coupler to generate a delayed output signal, wherein the phase delay imposed by the delay element is configured to make the delayed output signal antiphase, at a location along the second signal conduction path, to the signal induced in the second path by the first signal in the first path; and
    a coupler coupled to the second signal conduction path, the coupler being connected to the delay element and configured to inject the delayed output signal into the second signal conduction path.

2. The multiple-path amplifier of claim 1, including:
    a second directional coupler coupled to the second signal conduction path, the second directional coupler configured to produce a second output signal based on the second signal in the second path of the multiple-path amplifier;
    a second delay element configured to impose a second phase delay on the second output signal of the second directional coupler to generate a second delayed output signal; and
    a second coupler coupled to the first signal conduction path, the second coupler being connected to the second delay element and configured to inject the second delayed output signal into the first signal conduction path.

3. The multiple-path amplifier of claim 1, wherein the coupler includes at least one of a microstrip coupler, a power divider, and a power splitter.

4. The multiple-path amplifier of claim 1, wherein the first amplifier and the second amplifier are housed in a package selected from an air cavity package and an encapsulated package.

5. The multiple-path amplifier of claim 1, wherein a wavelength of the delayed output signal is within of a wavelength of the signal induced in the second signal conduction path.

6. The multiple-path amplifier of claim 1, wherein a magnitude of the output signal of the directional coupler is within 10 percent of a magnitude of the signal induced in the second signal conduction path.

7. A packaged device, comprising:
    a first amplifier coupled to a first signal conduction path;
    a second amplifier coupled to a second signal conduction path;
    a first coupler coupled to the first signal conduction path, the first coupler configured to produce an output signal based on a first signal carried by the first signal conduction path;
    a delay element configured to impose a phase delay on the output signal of the first coupler to generate a delayed output signal; and
    a second coupler coupled to the second signal conduction path, the second coupler being connected to the delay element and configured to inject the delayed output signal into the second signal conduction path to at least partially destructively interfere with a first induced signal that is induced in the second signal conduction path by the first signal carried by the first signal conduction path.

8. The device of claim 7, wherein a wavelength of the delayed output signal is within of a wavelength of a first induced signal that is induced in the second signal conduction path by the first signal carried by the first signal conduction path.

9. The device of claim 7, wherein a magnitude of the output signal of the first coupler is about equal to a magnitude of the first induced signal.

10. The device of claim 9, wherein the magnitude of the output signal of the first coupler is within 10 percent of the magnitude of the first induced signal.

11. The device of claim 7, including:
    a third coupler coupled to the second signal conduction path, the third coupler configured to produce a second output signal based on a second signal carried by the second signal conduction path;
    a second delay element configured to impose a second phase delay on the second output signal of the third coupler to generate a second delayed output signal; and
    a fourth coupler coupled to the first signal conduction path, the fourth coupler being connected to the second delay element and configured to inject the second delayed output signal into the first signal conduction path.

12. The device of claim 11, wherein the second phase delay imposed by the second delay element is configured to cause the second delayed output signal to at least partially destructively interfere with a second induced signal that is induced in the first signal conduction path by the second signal carried by the second signal conduction path.

13. The device of claim 11, wherein a second magnitude of the second output signal of the third coupler is about equal to a second magnitude of a second induced signal that is induced in the first signal conduction path by the second signal carried by the second signal conduction path.

14. The device of claim 7, wherein the packaged device includes a third signal conduction path and a third amplifier coupled to the third signal conduction path and including:
    a third coupler coupled to the third path, the third coupler configured to produce a third output signal based on a third signal in the third signal conduction path;
    a third delay element configured to impose a third phase delay on the third output signal of the third coupler to generate a third delayed output signal; and a fourth coupler coupled to at least one of the first signal conduction path and the second signal conduction path, the fourth coupler being connected to the third delay element and configured to inject the third delayed output signal into the at least one of the first signal conduction path and the second signal conduction path.

15. A device, comprising:
an adjustable directional coupler configured to couple to a first signal conduction path of an amplifier, the adjustable directional coupler configured to produce an output signal based on a first signal in the first signal conduction path of the amplifier, wherein a magnitude of the output signal is determined by a coupling factor of the adjustable directional coupler;
an adjustable delay element configured to impose a phase delay on the output signal of the adjustable directional coupler to generate a delayed output signal;
a coupler configured to couple to a second signal conduction path of the amplifier, the coupler being connected to the adjustable delay element and configured to inject the delayed output signal into the second signal conduction path; and
a controller configured to:
  detect a first output of at least one of a first amplifier coupled to the first path and a second amplifier coupled to the second path; and
  modify at least one of the coupling factor of the adjustable directional coupler and the phase delay of the adjustable delay element based upon the first output of the at least one of the first amplifier and the second amplifier.

16. The device of claim 15, wherein the controller is configured to, after modifying the at least one of the coupling factor and the phase delay:
  detect a second output of the at least one of the first amplifier and the second amplifier; and
  compare the first output to the second output.

17. The device of claim 15, including:
a second adjustable directional coupler configured to couple to the second signal conduction path and generate a second output signal;
a second adjustable delay element configured to impose a second phase delay on the second output signal of the adjustable directional coupler to generate a second delayed output signal; and
a second coupler configured to couple to the first signal conduction path, the second coupler being connected to the second adjustable delay element and configured to inject the second delayed output signal into the first signal conduction path.

18. The device of claim 15, wherein the first amplifier and the second amplifier are housed in a package selected from an air cavity package and an encapsulated package.

* * * * *